(12) United States Patent
Iizuka

(10) Patent No.: US 9,966,228 B2
(45) Date of Patent: May 8, 2018

(54) MULTI CHARGED PARTICLE BEAM APPARATUS, AND SHAPE ADJUSTMENT METHOD OF MULTI CHARGED PARTICLE BEAM IMAGE

(71) Applicant: NuFlare Technology, Inc., Yokohama-shi (JP)

(72) Inventor: Osamu Iizuka, Yokohama (JP)

(73) Assignee: NuFlare Technology, Inc., Yokohama-shi (JP)

(*) Notice: Subject to any disclaimer, the term of this patent is extended or adjusted under 35 U.S.C. 154(b) by 2 days.

(21) Appl. No.: 15/354,186

(22) Filed: Nov. 17, 2016

(65) Prior Publication Data
US 2017/0169993 A1    Jun. 15, 2017

(30) Foreign Application Priority Data
Dec. 9, 2015    (JP) ................. 2015-239986

(51) Int. Cl.
| H01J 37/30 | (2006.01) |
| H01J 37/20 | (2006.01) |
| G21K 5/04 | (2006.01) |
| H01J 37/317 | (2006.01) |
| H01J 37/04 | (2006.01) |
| H01J 37/244 | (2006.01) |

(52) U.S. Cl.
CPC ........ *H01J 37/3005* (2013.01); *H01J 37/045* (2013.01); *H01J 37/20* (2013.01); *H01J 37/244* (2013.01); *H01J 37/3177* (2013.01); *H01J 2237/0435* (2013.01); *H01J 2237/2448* (2013.01); *H01J 2237/30433* (2013.01)

(58) Field of Classification Search
CPC .. H01J 37/3005; H01J 37/3177; H01J 37/045; H01J 37/244; H01J 37/20; H01J 2237/0435; H01J 2237/2448; H01J 2237/30433
USPC ......... 250/396 R, 397, 492.1, 492.2, 492.21, 250/492.22, 492.23, 492.3
See application file for complete search history.

(56) References Cited

U.S. PATENT DOCUMENTS

| 5,304,811 A * | 4/1994 | Yamada ................ B82Y 10/00 250/398 |
| 6,855,929 B2 * | 2/2005 | Kimba ................. G01N 23/225 250/307 |

(Continued)

FOREIGN PATENT DOCUMENTS

JP    2015-35489    2/2015

*Primary Examiner* — Nicole Ippolito
(74) *Attorney, Agent, or Firm* — Oblon, McClelland, Maier & Neustadt, L.L.P.

(57) ABSTRACT

A multi charged particle beam apparatus includes a forming aperture array substrate, where there are formed a plurality of first openings and a plurality of second openings on the periphery of the whole plurality of first openings, each being larger than each of the plurality of first openings, to form multi-beams by the plurality of first openings, and to be able to form a plurality of calibration beams by the plurality of second openings, a shutter to select, one by one, one of the plurality of calibration beams formed by passing through the plurality of second openings, in accordance with a slide position, and a detector to detect a secondary electron including a reflected electron generated by scanning a mark by deflecting the selected calibration beam, in the state of all the multi-beams controlled to be OFF.

10 Claims, 11 Drawing Sheets

(56) References Cited

U.S. PATENT DOCUMENTS

| | | | |
|---|---|---|---|
| 2002/0148961 A1* | 10/2002 | Nakasuji | G01N 23/225 250/311 |
| 2004/0256556 A1* | 12/2004 | Winkler | B82Y 10/00 250/310 |
| 2012/0061565 A1* | 3/2012 | Enyama | H01J 37/265 250/307 |
| 2015/0041672 A1 | 2/2015 | Kamikubo | |

* cited by examiner

MULTI CHARGED PARTICLE BEAM APPARATUS, AND SHAPE ADJUSTMENT METHOD OF MULTI CHARGED PARTICLE BEAM IMAGE

CROSS-REFERENCE TO RELATED APPLICATION

This application is based upon and claims the benefit of priority from the prior Japanese Patent Application No. 2015-239986 filed on Dec. 9, 2015 in Japan, the entire contents of which are incorporated herein by reference.

BACKGROUND OF THE INVENTION

Field of the Invention

Embodiments of the present invention relate generally to a multi charged particle beam apparatus, and a shape adjustment method of multi charged particle beam image, and more specifically, relate, for example, to a method for adjusting the shape of a multi-beam image in multi-beam writing using electron beams.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" patterns on a wafer and the like with electron beams.

As a known example of employing the electron beam writing technique, there is a writing apparatus using multi-beams. Since it is possible for multi-beam writing to irradiate multiple beams at a time, the writing throughput can be greatly increased in comparison with single beam writing. A writing apparatus employing the multi-beam technique, for example, forms multi-beams by letting portions of an electron beam emitted from an electron gun pass through a corresponding hole of a plurality of holes in a mask, performs blanking control for each beam, reduces each unblocked beam by an optical system, and deflects it by a deflector so as to irradiate a desired position on a target object or "sample".

In multi-beam writing, the shape of an aperture array, which forms multi-beams, directly affects the accuracy of connection of writing figures. Therefore, adjustment of magnification and/or rotation of a multi-beam image to be formed is very important. However, since the current density of each beam is around several A/cm$^2$, it is difficult to accurately measure the position of each beam. Then, in order to obtain an S/N ratio, mark scanning operations of many times need to be performed using the same beam. Furthermore, since the size of the region of the aperture array is as large as several tens to several hundred μm, and therefore, the number of beams is large, it is difficult to accurately measure the shape of the image of the whole multi-beams. Accordingly, it becomes difficult to adjust the shape of a multi-beam image on the target object surface.

There is proposed a method for measuring a drift amount in a forming section of multi-beams by forming a plurality of measurement beams on the circumference of the multi-beams for writing, arranging detectors of the same number as the number of measurement beams near the height position of the crossover of the multi beams, and detecting positions of a plurality of measurement beams simultaneously (for example, refer to Japanese Patent Application Laid-open No. 2015-035489). However, it is difficult by this method to measure the shape of multi-beams on the surface of the target object.

The necessity of accurately measuring the shape of the image of the whole multi-beams is not limited to the case of the writing apparatus, and is important for general multi-beam apparatus using electron beams, etc. For example, it is also similarly important for an inspection apparatus, etc. which inspects patterns formed on the target object by multiple electron beams, etc.

BRIEF SUMMARY OF THE INVENTION

According to one aspect of the present invention, a multi charged particle beam apparatus includes a stage configured to mount a target object thereon and to be continuously movable; an emission source configured to emit a charged particle beam; a forming aperture array substrate, where there are formed a plurality of first openings and a plurality of second openings which are on a periphery of a whole of the plurality of first openings and each of which is larger than each of the plurality of first openings, configured to form multi-beams by making a region including a whole of the plurality of first openings irradiated by the charged particle beam and by making portions of the charged particle beam individually pass through a corresponding one of the plurality of first openings, and to be able to form a plurality of calibration beams by making a region including the plurality of second openings irradiated by the charged particle beam and by making portions of the charged particle beam individually pass through a corresponding one of the plurality of second openings; a shutter configured to select, one by one, one of the plurality of calibration beams which are formed by passing through the plurality of second openings, in accordance with a slide position; a mark arranged on the stage; a deflector configured to deflect a selected calibration beam of the plurality of calibration beams; a detector configured to detect a secondary electron including a reflected electron generated by scanning the mark by deflecting the selected calibration beam, in a state where all the multi-beams have been controlled to be OFF; and an irradiation region shape calculation processing circuit configured to calculate a shape of an irradiation region of a whole of the multi-beams by inputting, in order, a detection result of the secondary electron corresponding to each of the plurality of calibration beams which is obtained by switching the slide position of the shutter.

According to another aspect of the present invention, a method for adjusting a shape of a multi charged particle beam image includes forming multi-beams by letting portions of a charged particle beam individually pass through a corresponding opening of a plurality of first openings formed in a forming aperture array substrate, and forming a calibration beam by letting a portion of the charged particle beam pass through one of a plurality of second openings which is temporarily selected by sliding a shutter, each of the plurality second openings being larger than each of the plurality of first openings and formed on a periphery of a region including a whole of the plurality of first openings of the forming aperture array substrate; controlling all the multi-beams to be OFF; detecting a secondary electron including a reflected electron generated by scanning a mark on a stage on which a target object is placed, in order, for each of a plurality of calibration beams each corresponding to any one of the plurality second openings, while switching the each of the plurality of calibration beams formed by the plurality of second openings by switching a slide position of the shutter, in a state where the all the multi-beams have been controlled to be OFF; calculating a shape of an irradiation region of the whole of the multi-beams by inputting, in order, a detection result of the secondary electron corresponding to the each of the plurality of calibration beams formed by the plurality of second openings; and adjusting the shape of the irradiation region of the whole of the multi-beams by adjusting excitation to lenses configuring a reduction optical system for reducing an image of the multi-beams.

DETAILED DESCRIPTION OF THE INVENTION

It is examined to perform a mark scanning operation by applying beams per group (group of beams) which is composed of a plurality of beams each located at the four corners of multi-beams. However, even in such a case, it is necessary to increase the number of times of scanning of each group in order to substantially obtain the S/N ratio. If the the number of times of scanning increases, a beam drift occurs during a plurality of times of scanning, and therefore its influence is generated. On the other hand, it is also examined to increase the number of beams configuring each group in order to substantially obtain the S/N ratio. However, for increasing the number of beams to the extent of substantially obtaining the S/N ratio, it is necessary to greatly expand the area of a group of beams configuring each group. Therefore, along with needing to enlarge the calibration mark itself, the deflection region of an objective deflector also becomes large, and thus, the influence of deflection distortion and field curvature aberration is increased.

Embodiments of the present invention describe an apparatus and method that can substantially obtain the S/N ratio and measure the shape of a multi-beam image while reducing the influence of deflection distortion and field curvature aberration.

A first embodiment describes a configuration in which an electron beam is used as an example of a charged particle beam configuring multi charged particle beams. The charged particle beam is not limited to the electron beam, and other charged particle beam such as an ion beam may also be used.

Moreover, the first embodiment describes a multi-beam writing apparatus as an example of a multi charged particle beam apparatus using charged particles. The same configuration is applicable to other multi-beam apparatus, such as multi-beam inspection apparatus using charged particles, up to the step of applying multi-beams to the surface of the target object.

First Embodiment

Figure 1:
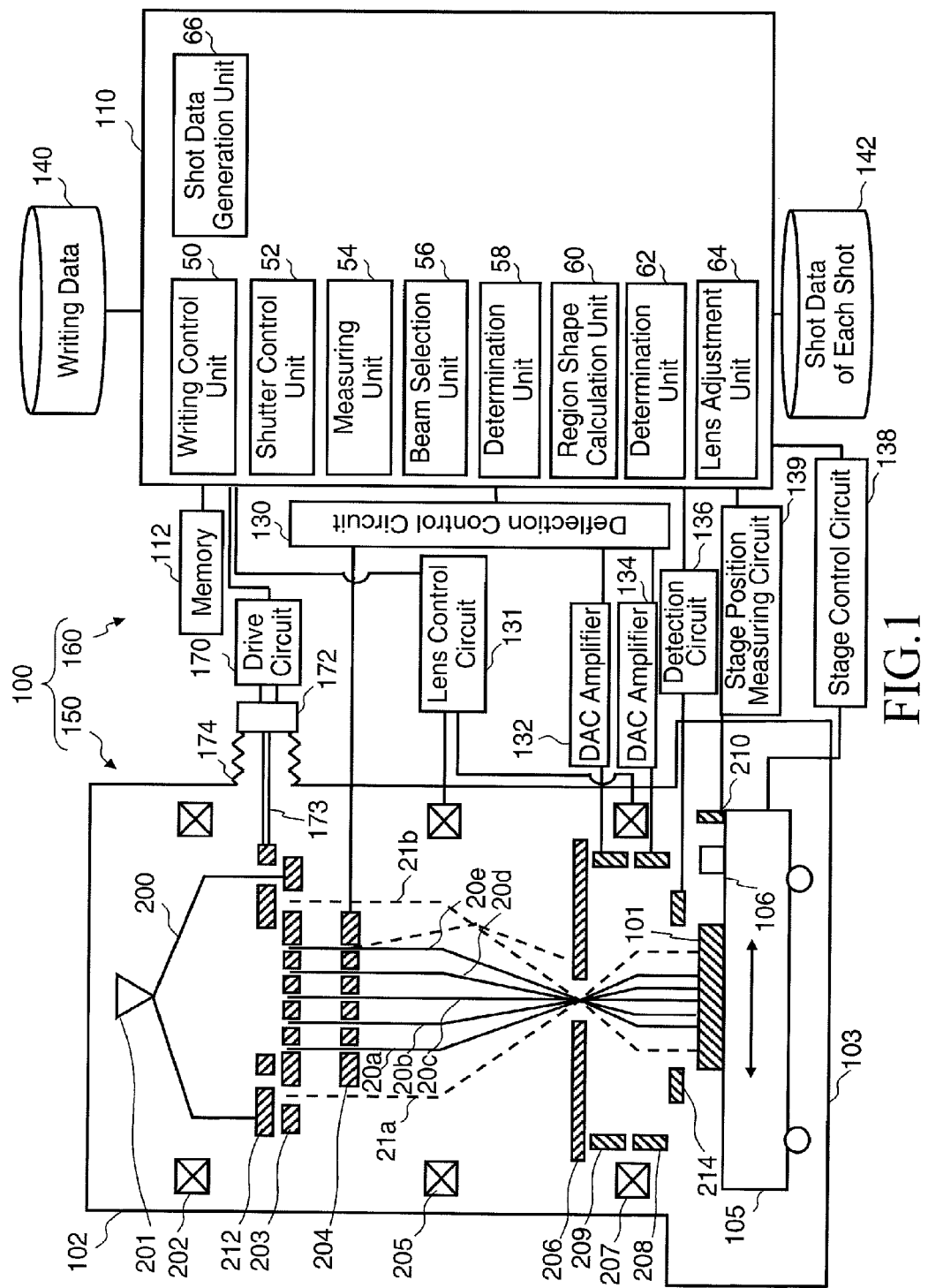
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control circuit 160. The writing apparatus 100 is an example of a multi charged particle beam writing apparatus. The writing mechanism 150 includes an electron optical column 102 and a writing chamber 103. In the electron optical column 102, there are arranged an electron gun 201, an illumination lens 202, a shutter 212, a forming aperture array substrate 203, a blanking aperture array mechanism 204, a reducing lens 205, a limiting aperture substrate 206, an objective lens 207, deflectors 208 and 209, and a detector 214. On the side of the electron optical column 102, there is arranged a slider 172 through an elastic piping 174. A shaft 173 of the slider 172 is connected to the shutter 212, and the slider 172 is driven by a drive device 170. In the writing chamber 103, an XY stage 105 is arranged. On the XY stage 105, a target object or "sample" 101 such as a mask serving as a writing target substrate is placed when writing is performed. The target object 101 is, for example, an exposure mask used for manufacturing semiconductor devices, or is a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 and a calibration mark 106 are arranged on the XY stage 105.

The control circuit 160 includes a control computer 110, a memory 112, a deflection control circuit 130, a lens control circuit 131, DAC (digital-analog converter) amplifier units 132 and 134, a detection circuit 136, a stage control circuit 138, a stage position measuring circuit 139, and storage devices 140 and 142 such as magnetic disk drives. The control computer 110, the memory 112, the deflection control circuit 130, the lens control circuit 131, the detection circuit 136, the stage control circuit 138, the stage position measuring circuit 139, and the storage devices 140 and 142 are connected with each other through a bus (not shown). Writing data is input from the outside of the writing apparatus 100 into the storage device 140 (storage unit) and stored therein. The deflection control circuit 130 is connected to the DAC amplifier units 132 and 134, and the blanking aperture array mechanism 204 through a bus. The stage position measuring circuit 139 irradiates the mirror 210 on the XY stage 105 with a laser beam, and receives a catoptric light from the mirror 210. Then, the stage position measuring circuit 139 measures the position of the XY stage 105 by using information of the catoptric light. The detection circuit 136 is connected to the detector 214. Preferably, the calibration mark 106 is quadrangular and its surface height position is adjusted to be the same height as the surface of the target object 101.

In the control computer 110, there are arranged a writing control unit 50, a shutter control unit 52, a measuring unit 54, a beam selection unit 56, a determination unit 58, a region shape calculation unit 60, a determination unit 62, a lens adjustment unit 64, and a shot data generation unit 66. Each of the "–units", such as the writing control unit 50, the shutter control unit 52, the measuring unit 54, the beam selection unit 56, the determination unit 58, the region shape calculation unit 60, the determination unit 62, the lens adjustment unit 64, and the shot data generation unit 66, includes a processing circuitry. As the processing circuitry, for example, an electric circuit, computer, processor, circuit board, quantum circuit, semiconductor device, or the like can be used. Each " . . . unit" may use a common processing circuitry (same processing circuitry), or different processing circuitries (separate processing circuitries). Data which is input and output to/from the writing control unit 50, the shutter control unit 52, the measuring unit 54, the beam selection unit 56, the determination unit 58, the region shape calculation unit 60, the determination unit 62, the lens adjustment unit 64, and the shot data generation unit 66, and data being operated are stored in the memory 112 each time.

FIG. 1 shows configuration elements necessary for describing the first embodiment. It should be understood that other configuration elements generally necessary for the writing apparatus 100 may also be included therein.

Figure 2:
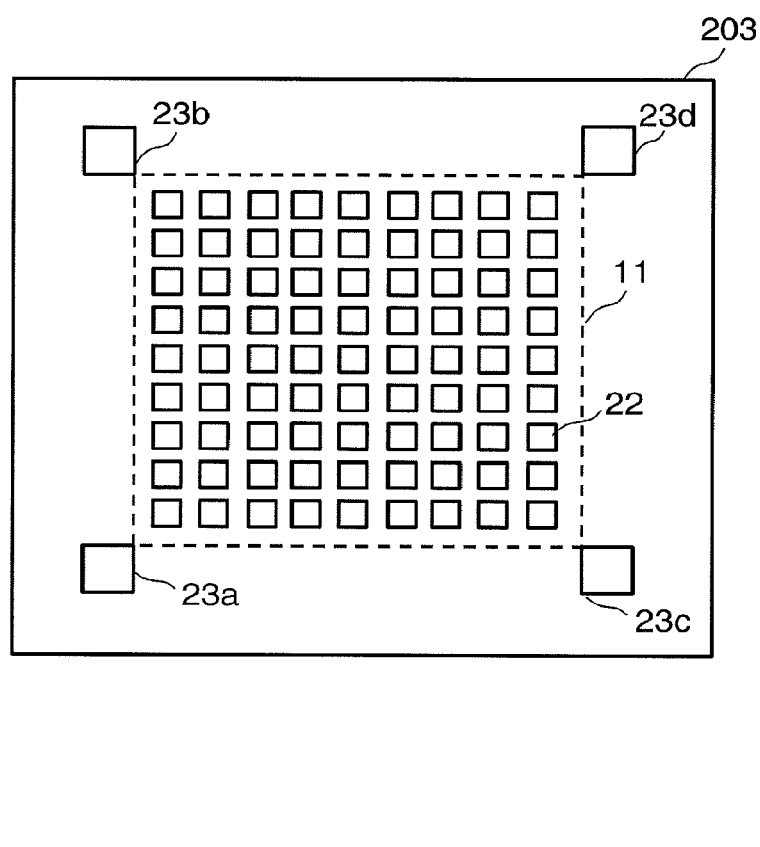
FIG. 2 is a conceptual diagram showing a configuration of a forming aperture array member according to the first embodiment.

FIG. 2 is a conceptual diagram showing a configuration of a forming aperture array member according to the first embodiment. As shown in FIG. 2, holes (openings) 22 of m rows long (y direction) and n columns wide (x direction) (m≥2, n≥2) are formed, like a matrix, at a predetermined arrangement pitch in the forming aperture array substrate 203. In FIG. 2, for example, holes 22 of 512 (rows in y direction)×512 (columns in x direction) are formed. Each of the holes 22 is a quadrangle of the same dimensional shape. Alternatively, each of the holes 22 can be a circle of the same circumference. Multi-beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2 where holes are arranged like a grid in the length and width directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

In the forming aperture array substrate 203, there are formed a plurality of holes 22 (first opening) of m rows long and n columns wide arranged in an array, and a plurality of holes 23a to 23d (second opening) which are on the periphery of the whole plurality of holes 22 (irradiation region 11) and each of which is larger than each of a plurality of holes 22. In the example of FIG. 2, one of holes 23 (23a to 23d) is individually formed at one of the four corners of the irradiation region 11 being the whole plurality of holes 22. The size of each hole 23 is the same as the region where p×q holes 22 are formed. In FIG. 2, the relation between the size and arrangement pitch of the hole 22, and the size of the hole 23 is not coincident with the description below. For example, in the case of forming holes 22 of 512 rows long×512 columns wide in the irradiation region 11, each hole 23 whose size is the same as the region where holes 22 for generating 32×32 beams are arranged is formed at each of the four corners. For example, when the current density J is 2 A/cm$^2$, if mark scanning is performed using 32×32 (=1024) beams each having the size of 0.01 μm squares, a total beam current of 2 nA is used for position detection. On the other hand, since the holes 22 are arranged at predetermined pitch, if the region where holes 22 for forming 32×32 beams are arranged is a rectangular region (5 μm×5 μm), for example, each hole 23 becomes a rectangular region of 5 μm×5 μm. In that case, one calibration beam formed by one hole 23 has a beam current of 500 nA. Therefore, compared with the case of mark scanning using 32×32 beams, it is possible to perform position detection with 250 times the current amount in the case of mark scanning using one calibration beam. Accordingly, when it needs to perform mark scanning using 32×32 beams 250 times in order to ensure an S/N ratio, if one calibration beam is used, one-time mark scanning is sufficient to ensure the S/N ratio without increasing the area of the beam irradiation region. The hole 23 is preferably formed in the same size as the region where one hundred or more holes 22 are arranged, for example. More preferably, the hole 23 is formed in the same size as the region where one thousand or more holes 22 are arranged, for example.

Figure 3:
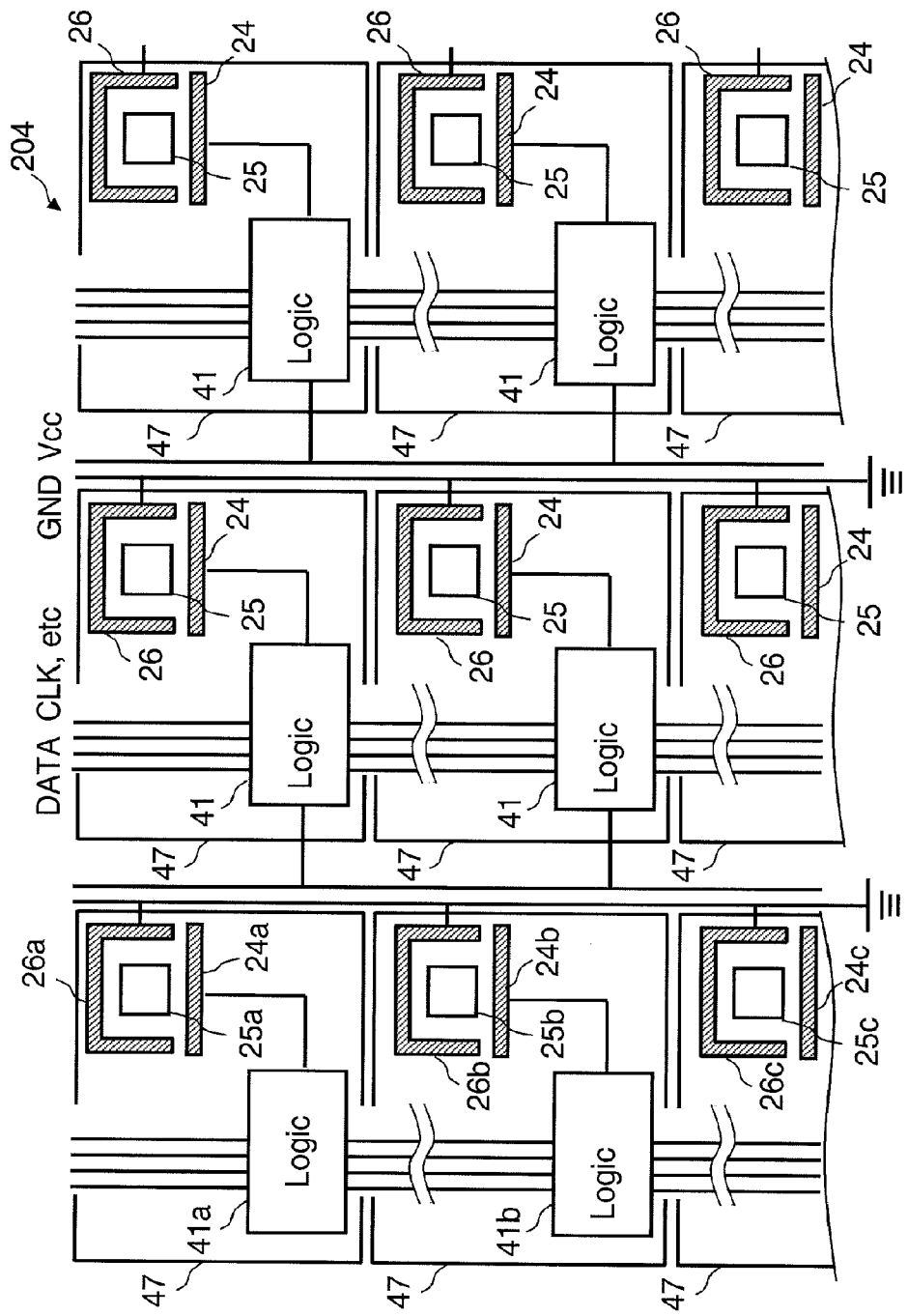
FIG. 3 is a top view conceptual diagram showing a part of a blanking aperture array unit according to the first embodiment.

FIG. 3 is a top view conceptual diagram showing a part of a blanking aperture array unit according to the first embodiment. In FIG. 3, the positional relation of electrodes 24 and 26 and the positional relation of a control circuit 41 are not in accordance with each other. As shown in FIG. 3, in the blanking aperture array mechanism 204, there are formed passage holes 25 (openings), through which multiple beams individually pass, at the positions each corresponding to each hole 22 of the forming aperture array substrate 203 of FIG. 2. Then, a pair of electrodes 24 and 26 (blanker: blanking deflector) for blanking deflection is arranged close to each passage hole 25 in a manner such that the electrodes 24 and 26 are opposite each other with respect to the passage hole 25 concerned. Moreover, close to each passage hole 25, there is arranged a control circuit 41 (logic circuit) for applying a deflection voltage to, for example, the electrode 24 for each passage hole 25. The other one (the electrode 26, for example) of the two electrodes 24 and 26 for each beam is connected to the grounded (earthed). Further, for example, 10-bit line for control signal is connected to each control circuit 41. In addition to the 10-bit line, for example, a clock signal line, a power source line, and the like are connected to each control circuit 41. An individual blanking system 47 composed of the electrodes 24 and 26 and the control circuit 41 is configured for each beam of multi-beams. A control signal for each control circuit 41 is output from the deflection control circuit 130. Moreover, a shift register (not shown) is arranged in each control circuit 41, and for example, shift registers for beams in one row of n×m multi beams in the control circuit are connected in series. For example, control signals for beams in one row of the n×m multi beams are transmitted in series. For example, a control signal of each beam is stored in a corresponding control circuit 41 by clock signals of n times.

The electron beam 20 passing through a corresponding passage hole is independently deflected by the voltage applied to the two electrodes 24 and 26 being a pair. Blanking control is performed by this deflection. Blanking deflection is performed for each corresponding beam of the multi-beams. Thus, each of a plurality of blankers performs blanking deflection of a corresponding beam of the multi-beams having passed through a plurality of holes 22 (openings) of the forming aperture array substrate 203.

In the blanking aperture array mechanism 204, at the position corresponding to each hole 23 of the forming aperture array substrate 203, a passage hole (opening) for letting a corresponding calibration beam pass is formed. However, a pair of the electrodes 24 and 26 for blanking deflection is unnecessary for this passage hole for the calibration beam. That is, only a passage hole is needed, and blanking control by the blanking aperture array mechanism 204 is not needed.

Figure 4A:
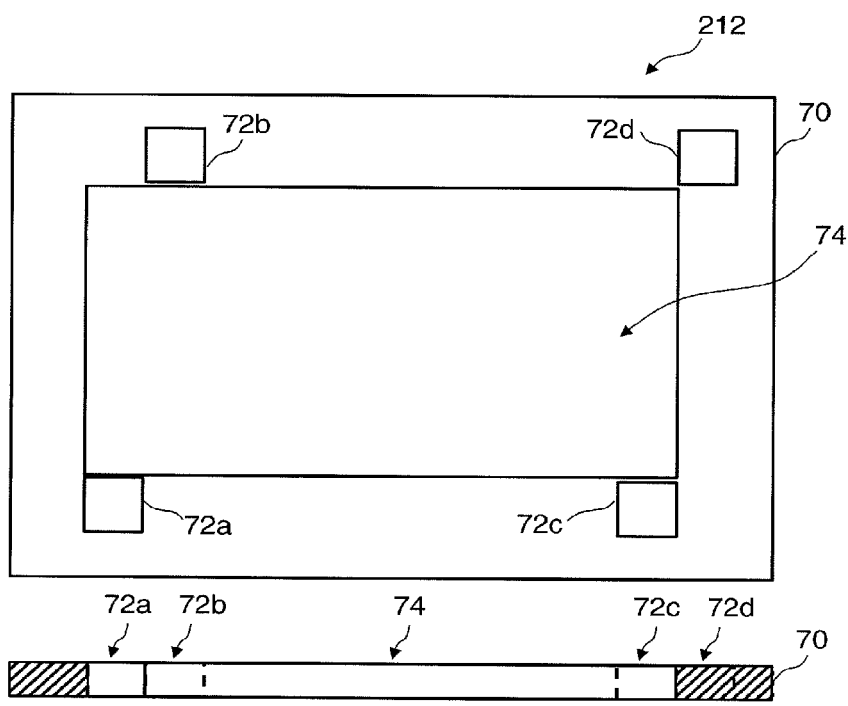
FIGS. 4A and 4B are upper surface conceptual diagrams showing an example of a shutter according to the first embodiment.
Figure 4B:

FIGS. 4A and 4B are upper surface conceptual diagrams showing an example of a shutter according to the first embodiment. FIG. 4B is a sectional view of FIG. 4A at the position of an opening 74. In the shutter 212 of FIGS. 4A and 4B, there are formed the opening 74 penetrating the center part of a frame 70, and a plurality of openings 72a to 72d (second opening) on the periphery of the opening 74 and at the four corners shifted in the x direction. The size of each of a plurality of openings 72a to 72d is a little larger than that of the hole 23.

Figure 5A:
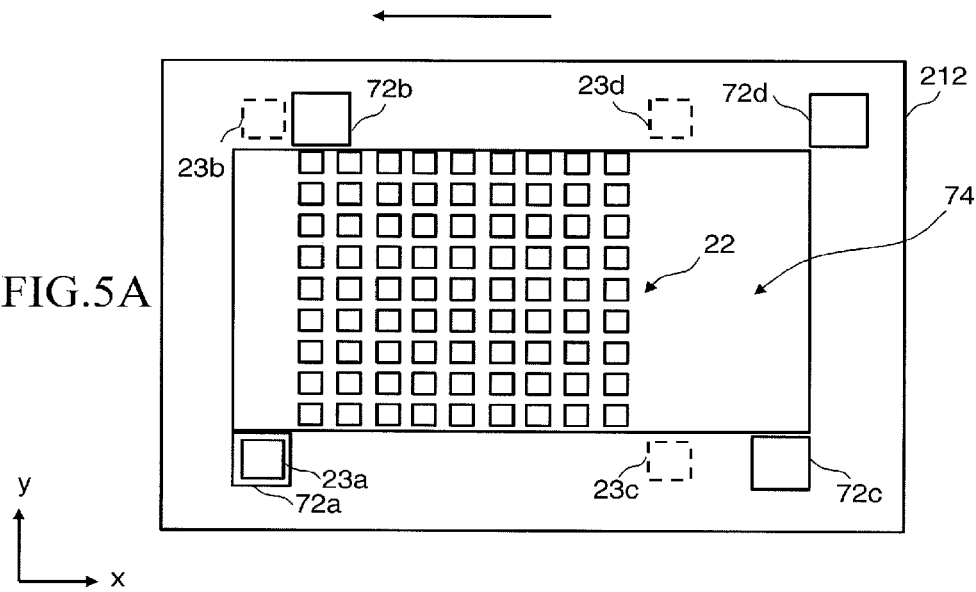
FIGS. 5A and 5B are upper surface conceptual diagrams for explaining an overlap situation between the shutter and the forming aperture array substrate according to the first embodiment.
Figure 5B:
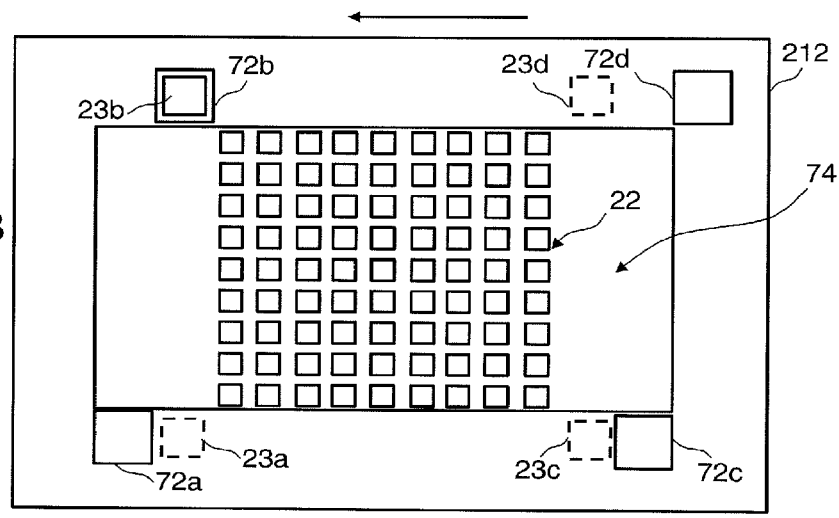

FIGS. 5A and 5B are upper surface conceptual diagrams for explaining an overlap situation between the shutter and the forming aperture array substrate according to the first embodiment. As will be described later, the shutter 212 is shifted in the −x direction by the size of one of a plurality of openings 72a to 72d one by one. As shown in FIG. 5A, first, the opening 72a in a plurality of openings 72a to 72d overlaps with the hole 23a of the forming aperture array, substrate 203. Next, as shown in FIG. 5B, the opening 72b overlaps with the hole 23b of the forming aperture array substrate 203 by the shift of the shutter 212. Next, the opening 72c overlaps with the hole 23c of the forming aperture array substrate 203, and then the opening 72d overlaps with the hole 23d of the forming aperture array substrate 203. During this operation, all the holes 22 of the forming aperture array substrate 203 are always located in the opening 74. Due to this, even when any one of a plurality of holes 23a to 23d of the forming aperture array substrate 203 overlaps with a corresponding one of a plurality of openings 72a to 72d, multi-beams 20 can be formed by receiving irradiation of the electron beam 200 by the whole holes 22 (first opening) of the forming aperture array substrate 203, and letting portions of the electron beam 200 individually pass through a corresponding hole of all the plurality of holes 22. In other words, the opening 74 larger than the irradiation region of the whole multi-beams is formed in the shutter 212. Further, in other words, the opening 74 which can form the whole of the multi-beams 20 is formed. Furthermore, in other words, the opening 74 is formed in the size where, in addition to a plurality of holes 22, the holes 23 whose number is the same as that of the plurality of holes 23 can be arranged in the slide direction.

On the other hand, it is possible to form a plurality of calibration beams 21 by receiving irradiation of the electron beam 200 by a plurality of holes 23a to 23d (second opening) of the forming aperture array substrate 203, and letting portions of the electron beam 200 individually pass through a corresponding hole of a plurality of holes 23a to 23d. However, according to the first embodiment, the shutter 212 is arranged on purpose. Thereby, the shutter 212 selects, in accordance with the slide position, one of a plurality of calibration beams 21 one by one which are formed by passing through a plurality of holes 23a to 23d. According to the first embodiment, the shutter 212 is arranged, for example, between the electron gun 201 and the forming aperture array substrate 203, that is on the upstream side of the optical axis of the forming aperture array substrate 203. By arranging the shutter 212 on the upstream side of the optical axis of the forming aperture array substrate 203, it is possible to select one of a plurality of calibration beams 21 before forming the plurality of calibration beams 21. Thereby, interference between the calibration beams 21 can be avoided.

The shutter 212 can also be arranged between the forming aperture array substrate 203 and the blanking aperture array mechanism 204, or on the downstream side of the optical axis of the blanking aperture array mechanism 204, besides the upstream side of the optical axis of the forming aperture array substrate 203. In that case, it is possible to select one of a plurality of calibration beams 21 by the shutter 212 after forming the plurality of calibration beams 21. Moreover, the opening 74 through which the entire multi-beams 20 can pass is formed in the shutter 212. Therefore, it is possible to make the entire multi-beams 20 pass through. However, in the viewpoint of suppressing interference between the calibration beams 21, the shutter 212 is preferably arranged on the upstream side of the optical axis of the forming aperture array substrate 203.

Figure 6:
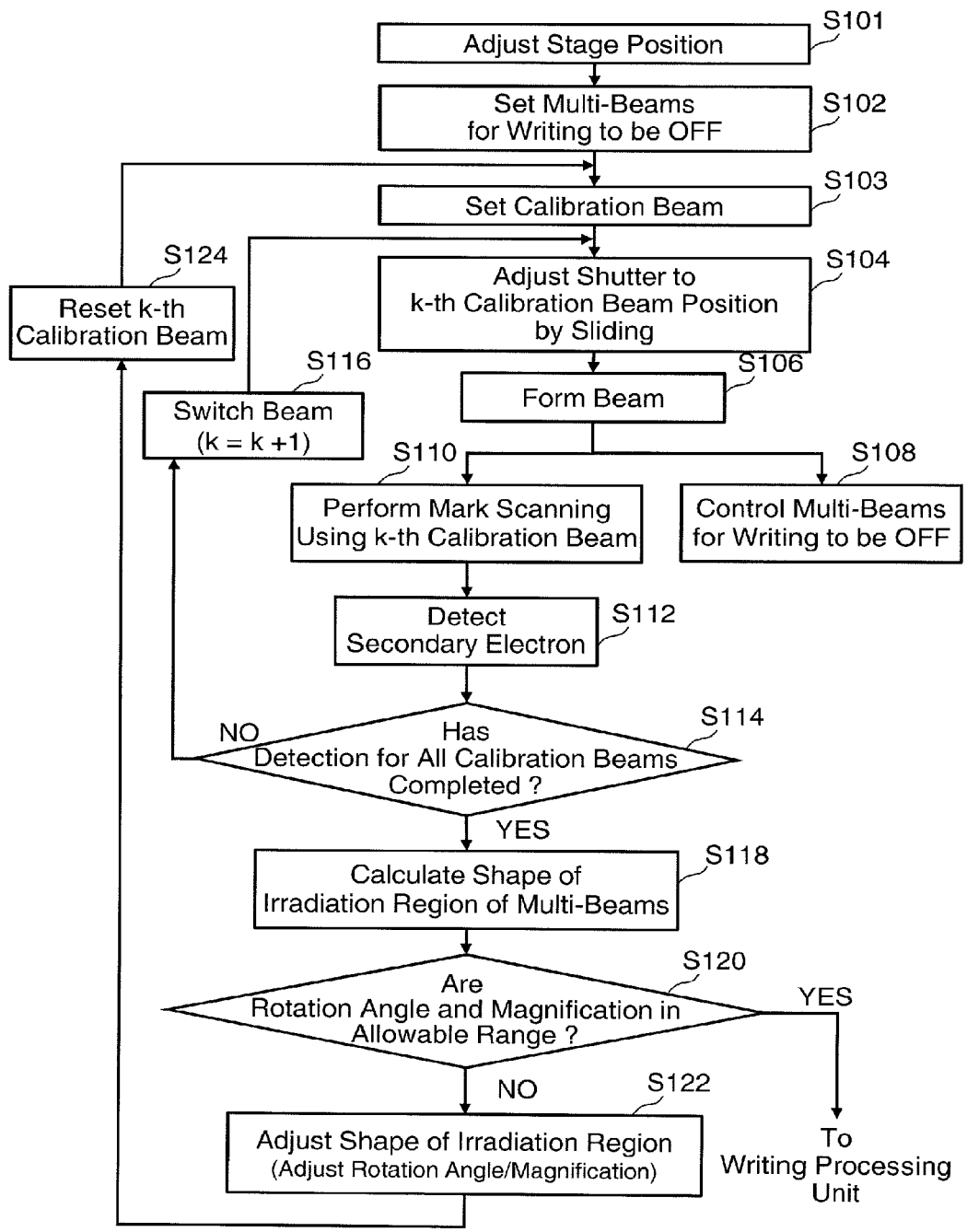
FIG. 6 is a flowchart showing main steps of a shape adjustment method of a multi-beam image according to the first embodiment.

FIG. 6 is a flowchart showing main steps of a shape adjustment method of a multi-beam image according to the first embodiment. As shown in FIG. 6, the shape adjustment method of a multi-beam image according to the first embodiment executes a series of steps: a stage position adjustment step (S101), a beam OFF setting step (S102), a calibration beam selection step (S103), a shutter position adjustment (shutter slide) step (S104), a beam forming step (S106), a writing-multi-beams beam OFF step (S108), a mark scanning step (S110) using k-th calibration beam, a secondary electron detection step (S112), a determination step (S114), a calibration beam switching step (S116), a multi-beam irradiation region shape calculation step (S118), a determination step (S120), a multi-beam irradiation region shape adjustment step (S122), and a reset step (S124).

In the stage position adjustment step (S101), the writing control unit 50 outputs a control signal to the stage control circuit 138 so that the calibration mark 106 may be located in the deflection region of the calibration beam. The stage control circuit 138 adjusts the position by moving the stage 105 such that the calibration mark 106 is located in the deflection region of the calibration beam. The inside of the electron optical column 102 and the writing chamber 103 is controlled to be in a vacuum state of a predetermined pressure lower than the atmospheric pressure because the internal gas is exhausted by a vacuum pump (not shown).

In the beam OFF setting step (S102), the writing control unit 50 controls all the beams of the multi-beams 20 to be in an OFF state. Specifically, the writing control unit 50 outputs a control signal to the deflection control circuit 130 so that all the beams of the multi-beams 20 may be in an OFF state. The deflection control circuit 130 outputs beam OFF signals to the control circuits 41 for all the beams of the multi-beams 20 in the blanking aperture array mechanism 204. Thereby, a blanking voltage is applied between the electrodes 24 and 26 for each beam.

In the calibration beam selection step (S103), the beam selection unit 56 selects one of a plurality of calibration beams 21.

In the shutter position adjustment (shutter slide) step (S104), the shutter control unit 52 outputs, to the drive device 170, a control signal for adjusting the position of the shutter 212 to be located at the position where the selected calibration beam 21 can be formed. The drive device 170 slides the shutter 212 by driving the slider 172, and adjusts the position of the shutter 212 to be located at the position where the selected calibration beam 21 can be formed. In this case, for example, the calibration beam 21a is selected, and the shutter 212 is moved to the position where the hole 72a of the shutter 212 overlaps with the hole 23a of the forming aperture array substrate 203. Since the slider 172 is connected to the electron optical column 102 by the elastic piping 174, such as a bellows pipe, no vacuum break occurs by the driving.

In the beam forming step (S106), each beam is formed under the control of the writing control unit 50. Specifically, the electron beam 200 emitted from the electron gun 201 (emission source) illuminates the shutter 212 almost vertically with the illumination lens 202. In that case, the electron beam 200 passes through the opening 74 of the shutter 212, and illuminates the region including all of a plurality of holes 22 of the forming aperture array substrate 203. Simultaneously, the electron beam 200 passes through the opening 72a of the shutter 212, and illuminates the whole of the hole 23a in a plurality of holes 23 of the forming aperture array substrate 203. A plurality of rectangular electron beams (multi-beams) 20a to 20e, for example, are formed by letting portions of the electron beam 200, which irradiates the positions of a plurality of holes 22, individually pass through a corresponding hole of a plurality of holes 22 (a plurality of first openings) of the forming aperture array substrate 203. Simultaneously, one rectangular calibration beam 21a, for example, in a plurality of calibration beams 21 is formed by letting a portion of the electron beam 200, which irradiates the position of the hole 23a temporarily selected, pass through the hole 23a of the forming aperture array substrate 203.

In the writing-multi-beams beam OFF step (S108), the blanking aperture array mechanism 204 controls all the beams of the multi-beams 20 to be in an OFF state.

Figure 7:
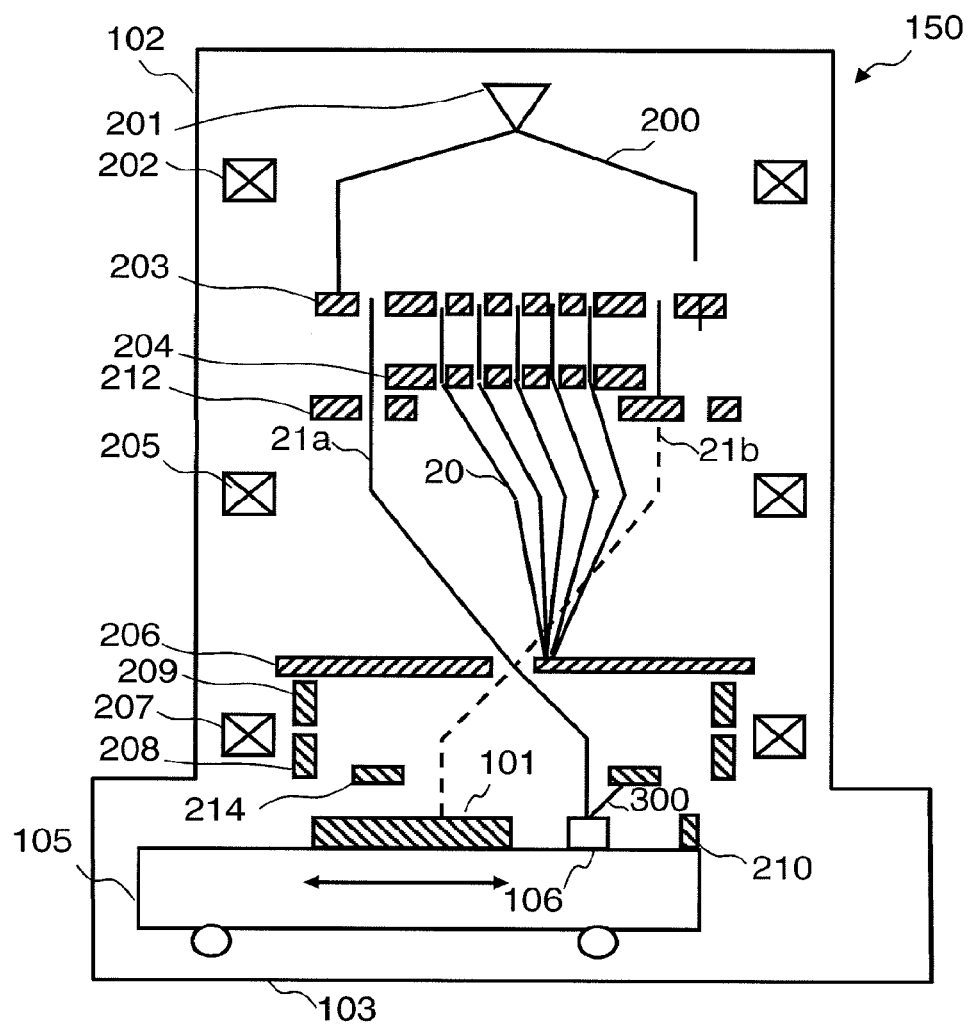
FIG. 7 shows a state in which multi-beams are made to be OFF, and irradiation is performed by one selected calibration beam according to the first embodiment.

FIG. 7 shows a state in which multi-beams are made to be OFF, and irradiation is performed by one selected calibration beam according to the first embodiment. As shown in FIG. 7, formed multi-beams 20a to 20e individually passes through a corresponding blanker (first deflector: individual blanking mechanism) of the blanking aperture array mechanism 204. The blanker performs blanking deflection such that each of the electron beam 20 passing individually is maintained to be in an OFF state.

The multi-beams 20a to 20e having passed through the blanking aperture array mechanism 204 are reduced by the reducing lens 205, and go toward the hole in the center of the limiting aperture substrate 206. The electron beam 20 which was deflected by the blanker of the blanking aperture array mechanism 204 deviates from the hole in the center of the limiting aperture substrate 206 (blanking aperture member), and is blocked by the limiting aperture substrate 206. In the example of FIG. 7, since all the beams of the multi-beams 20 are controlled to be in an OFF state, they are blocked by the limiting aperture substrate 206. On the other hand, one calibration beam 21 having been formed passes through the inside of a corresponding opening of the blanking aperture array mechanism 204. Since the blanker is not arranged, the calibration beam 21 passes in an unchanged state. The one calibration beam 21 having passed through the blanking aperture array mechanism 204 is reduced by the reducing lens 205, and go toward the hole in the center of the limiting aperture substrate 206. Then, it passes through the hole in the center of the limiting aperture substrate 206 as shown in FIG. 7.

In the mark scanning step (S110) using k-th calibration beam, the writing control unit 50 scans, using the selected calibration beam 21, the calibration mark 106 on the stage 105 where the target object 101 is placed. Specifically, scanning is performed on the calibration mark 106 by deflecting the calibration beam 21 by using the deflector 208 (or deflector 209).

In the secondary electron detection step (S112), the detector 214 detects a secondary electron 300 including a reflected electron generated by scanning the calibration mark 106 by deflecting the selected calibration beam 21 in the state where all the beams of the multi-beams 20 have been controlled to be OFF. The detected data is output to the detection circuit 136. The detection circuit 136 converts the input analog data into digital data, and outputs it as position data to the measuring unit 54. Thereby, the position of the selected calibration beam 21 (for example, calibration beam 21a) can be individually detected.

In the determination step (S114), the determination unit 58 determines whether positions of all the calibration beams 21 have been detected. When there remains the calibration beam 21 whose position has not been detected yet, it goes to the calibration beam switching step (S116). When the positions of all the calibration beams 21 have been detected, it goes to the multi-beam irradiation region shape calculation step (S118).

In the calibration beam switching step (S116), the beam selection unit 56 switches the selected calibration beam 21 to another calibration beam 21 by performing reselection. Then, it returns to the shutter position adjustment (shutter slide) step (S104). Then, each step from the shutter position adjustment (shutter slide) step (S104) to the calibration beam switching step (S116) is repeated until position detection for all the calibration beams 21 has been completed in the determination step (S114).

As described above, according to the first embodiment, the shutter 212 selects, one by one, one of the plurality of calibration beams 21 which are formed by passing through the plurality of holes 23, in accordance with a slide position of the shutter 212. Then, in the state where all the beams of the multi-beams 20 have been controlled to be OFF, while switching each calibration beam 21 formed by a plurality of holes 23 by switching the slide position of the shutter 212, the secondary electron 300 including a reflected electron from the calibration mark 106 is detected in order for each calibration beam 21 by scanning the calibration mark 106 on the stage 105 on which the target object 101 is placed.

In the multi-beam irradiation region shape calculation step (S118), the region shape calculation unit 60 (irradiation region shape calculation processing circuit) calculates the shape of the irradiation region 11 of the whole multi-beams 20 by inputting, in order, a detection result of the secondary electron 300 corresponding to each calibration beam 21 of a plurality of calibration beams 21 which are obtained by switching the slide position of the shutter 212. If the positions of the four calibration beams 21 can be detected, it is possible to detect the positions of the four peripheral corners of the irradiation region 11 of the whole multi-beams 20. Therefore, the rectangular irradiation region 11 of the whole multi-beams 20 can be calculated.

Although the positions of the four peripheral corners of the irradiation region 11 of the whole multi-beams 20 are measured using the calibration beams 21 in the example described above, it is not limited thereto. The calibration beam 21 may further be formed at another position on the periphery of the irradiation region 11 in addition to the four peripheral corners of the irradiation region 11. If the number of the measurement points increases, the shape of the irradiation region 11 can be calculated with great accuracy by the amount of the increase. The passage hole (hole 72) of the shutter 212 should be formed such that one of a plurality of calibration beams 21 can be detected one by one even in that case.

In the determination step (S120), the determination unit 62 determines whether the rotation angle of the calculated irradiation region shape of the whole multi-beams 20 is within an allowable range. Moreover, the determination unit 62 determines whether the magnification of the calculated irradiation region shape of the whole multi-beams 20 is within an allowable range. If the both are within the allowable ranges, it goes to writing processing. When at least one of the rotation angle and the magnification is out of the allowable range, it goes to the multi-beam irradiation region shape adjustment step (S122).

In the multi-beam irradiation region shape adjustment step (S122), the lens adjustment unit 64 makes an adjustment of the shape of the irradiation region of the whole multi-beams by adjusting the excitation to lenses configuring the reduction optical system for reducing the image of the multi-beams 20. The rotation angle and the magnification of a multi-beam image can be adjusted by adjusting the excitation to the reducing lens 205 and the objective lens 207 configuring the reduction optical system. Then, according to the first embodiment, the shape of the irradiation region of the whole multi-beams is adjusted by adjusting the excitation to the lenses. The lens adjustment unit 64 outputs an excitation control signal to the lens control circuit 131. The lens control circuit 131 makes an adjustment of the excitation to the reducing lens 205 and the objective lens 207.

The adjustment of the shape of the irradiation region of the whole multi-beams is not limited to the method described above. For example, it is also preferable to perform a rotational adjustment of the irradiation region shape of the whole multi-beams by rotating the forming aperture array substrate 203 and the blanking aperture array mechanism 204 by a rotation mechanism (not shown). Alternatively, it is also preferable to perform a rotational adjustment of the irradiation region shape of the whole multi-beams by relatively rotating the irradiation position of the multi-beams by rotating the stage 105 by a rotation mechanism (not shown).

In the reset step (S124), the beam selection unit 56 resets the selected k-th calibration beam 21, and then, it is returned to the calibration beam selection step (S103). Then, each step from the calibration beam selection step (S103) to the determination step (S120) is repeated. This checks whether the rotation angle of the irradiation region shape of the whole multi-beams 20 has come within an allowable range by the adjustment of the multi-beam irradiation region shape adjustment step (S122). If the rotation angle of the irradiation region shape has not come within the allowable range, the multi-beam irradiation region shape adjustment step (S122) is again performed, and its adjustment result should be checked similarly.

Next, after completing the adjustment of the shape of the multi-beam irradiation region, writing processing is performed. The writing mechanism 150 operates as described below under the control of the writing control unit 50.

As described above, a plurality of rectangular electron beams (multi-beams) 20a to 20e, for example, are formed by letting portions of the electron beam 200 individually pass through a corresponding hole of a plurality of holes 22 (a plurality of first openings) of the forming aperture array substrate 203. When executing writing processing, as shown in FIG. 1, the shutter 212 blocks all the holes 23 by further moving the shutter 212 so that the calibration beam 21 may not be formed.

The multi-beams 20a to 20e having passed through the blanking aperture array mechanism 204 are reduced by the reducing lens 205, and go toward the hole in the center of the limiting aperture substrate 206. At this stage, the electron beam 20 which was deflected by the blanker of the blanking aperture array mechanism 204 deviates from the hole in the center of the limiting aperture substrate 206 (blanking aperture member) and is blocked by the limiting aperture substrate 206. On the other hand, the electron beam 20 which was not deflected by the blanker of the blanking aperture array mechanism 204 passes through the hole in the center of the limiting aperture substrate 206, if it is not deflected by the deflector 212 (common blanking mechanism 213), as shown in FIG. 1. Blanking control is performed by combination of ON/OFF of the individual blanking mechanism 47 and ON/OFF of the common blanking mechanism 213 so as to control ON/OFF of the beam. Thus, the limiting aperture substrate 206 blocks each beam which was deflected to be in an OFF state by the individual blanking mechanism 47. Then, each beam of one shot is formed by a beam made during a period from becoming ON to becoming OFF and having passed through the limiting aperture substrate 206. The multi-beams 20 having passed through the limiting aperture substrate 206 are focused by the objective lens 207 so as to be a pattern image of a desired reduction ratio. Respective beams (the whole of the multi-beams 20) having passed through the limiting aperture substrate 206 are collectively deflected in the same direction by the deflectors 208 and 209 in order to irradiate respective beam irradiation positions on the target object 101. While the XY stage 105 is continuously moving, controlling is performed by the deflector 208 so that the irradiation positions of the beams may follow (track) the movement of the XY stage 105, for example. The multi-beams 20 irradiating at a time are ideally aligned at pitches obtained by multiplying the arrangement pitch of a plurality of holes of the forming aperture array substrate 203 by a desired reduction ratio.

Figure 8:
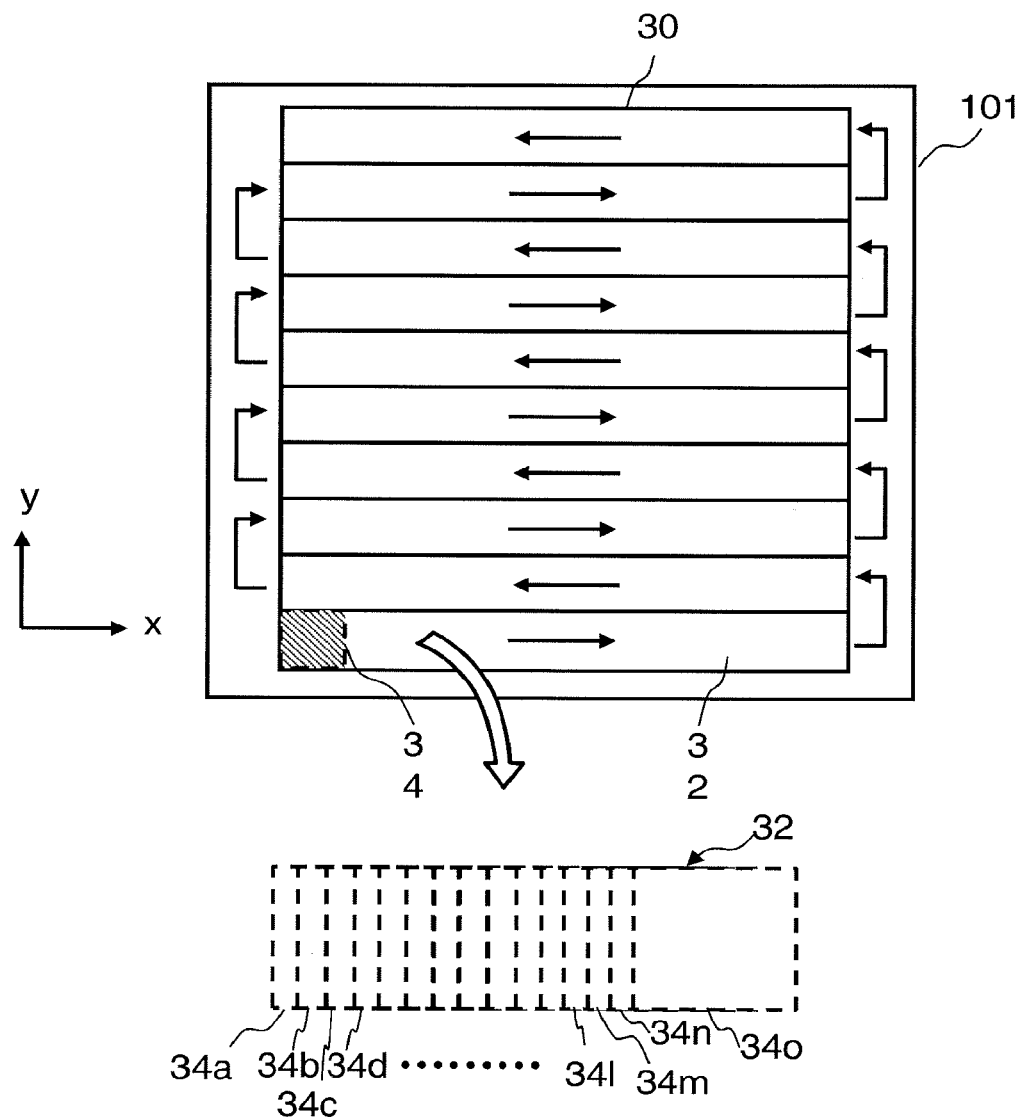
FIG. 8 is a conceptual diagram explaining an example of a writing operation according to the first embodiment.

FIG. 8 is a conceptual diagram explaining an example of a writing operation according to the first embodiment. As shown in FIG. 8, a writing region 30 of the target object 101 is virtually divided into a plurality of stripe regions 32 each in a strip shape and each having a predetermined width in the y direction, for example. First, the XY stage 105 is moved to make an adjustment such that an irradiation region 34 which may be irradiated with one irradiation of the multi-beams 20 is located at the left end of the first stripe region 32 or at a position more left than the left end, and then writing is started. For example, when writing the first stripe region 32 by moving the XY stage 105 in the −x direction, the writing advances relatively in the x direction. The XY stage 105 is moved, for example, continuously at a constant speed. After writing (exposing) the first stripe region 32, the stage position is moved in the −y direction to make an adjustment such that the irradiation region 34 is located at the right end of the second stripe region 32 or at a position more right than the right end and located relatively in the y direction, and then, by moving the XY stage 105 in the x direction, for example, writing advances in the −x direction. That is, writing is performed while alternately changing the direction, such as performing writing (exposing) in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. A plurality of shot patterns are generated at a time by one shot of multi-beams which have been formed by passing through each of the holes 22 of the forming aperture array substrate 203, that is, the number of shot patterns generated at a time is equal to the number of the holes 22 at the maximum.

Figure 9:
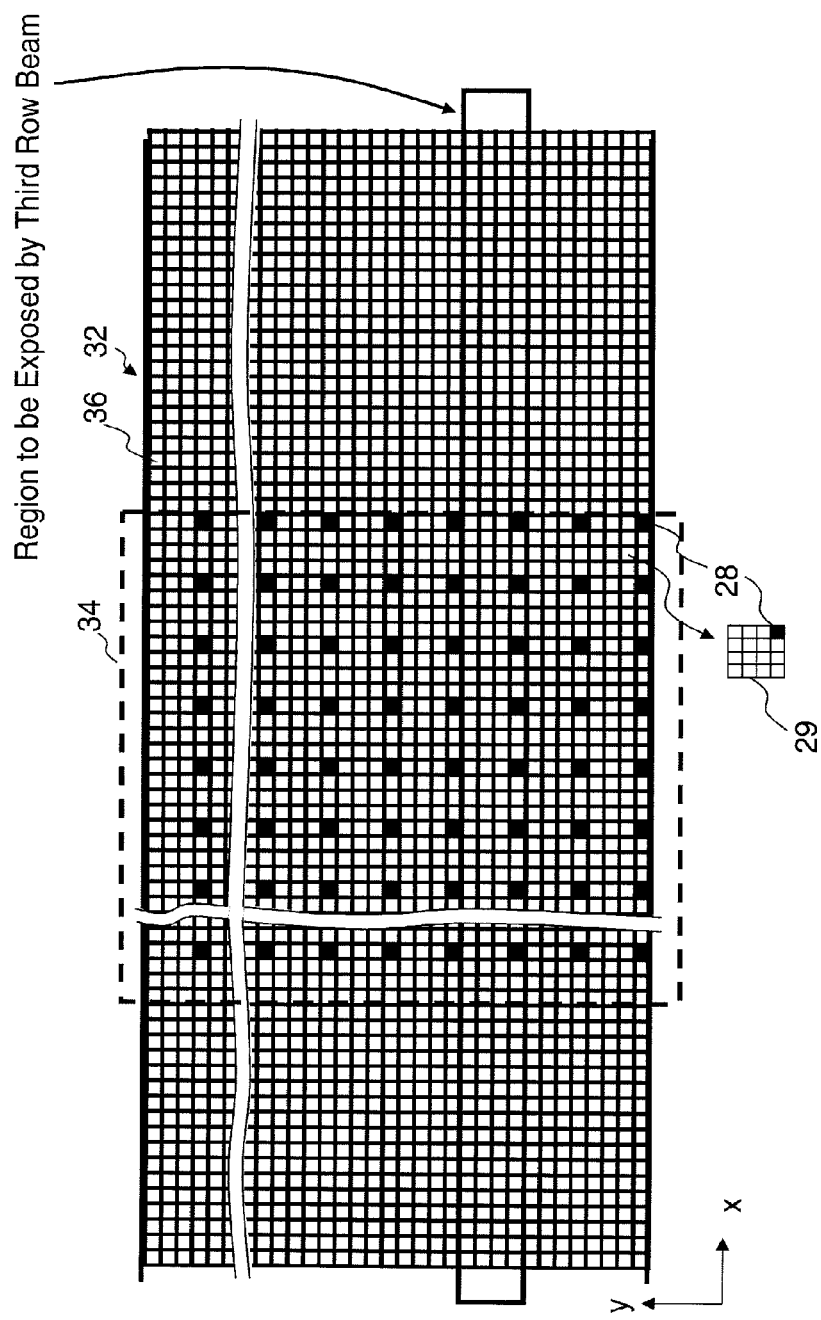
FIG. 9 shows an example of an irradiation region of multi-beams and a writing target pixel according to the first embodiment.

FIG. 9 shows an example of an irradiation region of multi-beams and a pixel to be written (writing target pixel) according to the first embodiment. In FIG. 9, the stripe region 32 is divided into a plurality of mesh regions by the size of a beam of multi-beams, for example. Each mesh region serves as a writing target pixel 36 (unit irradiation region, or writing position). The size of the writing target pixel 36 is not limited to the beam size, and it may be an arbitrary size regardless of the beam size. For example, it may be 1/n (n being an integer of 1 or more) of the beam size. In other words, a plurality of mesh regions obtained by dividing the writing region 30 of the target object 101 by the size of the unit irradiation region of a beam of multi-beams are defined as a plurality of pixels 36 (small regions). FIG. 9 shows the case where the writing region of the target object 101 is divided in the y direction into a plurality of stripe regions 32 by the width size being substantially the same as the size of the irradiation region 34 (writing field) which can be irradiated by one irradiation of the multi-beams 20, for example. The width of the stripe region 32 is not limited to this. It is also preferable for the width of the stripe region 32 to be n times (n being an integer of 1 or more) the size of the irradiation region 34. FIG. 9 shows the case of multi-beams of 512×512 (rows by columns). In the irradiation region 34, there are shown a plurality of pixels 28 (writing positions of beams) which can be irradiated by one irradiation of the multi-beams 20. In other words, the pitch between the adjacent pixels 28 is the pitch between beams of the multi-beams. In the example of FIG. 9, one grid 29 is a square region surrounded at four corners by four adjacent pixels 28, and it includes one of the four pixels 28. In the example of FIG. 9, each grid 29 is configured by 4×4 pixels.

Figure 10:
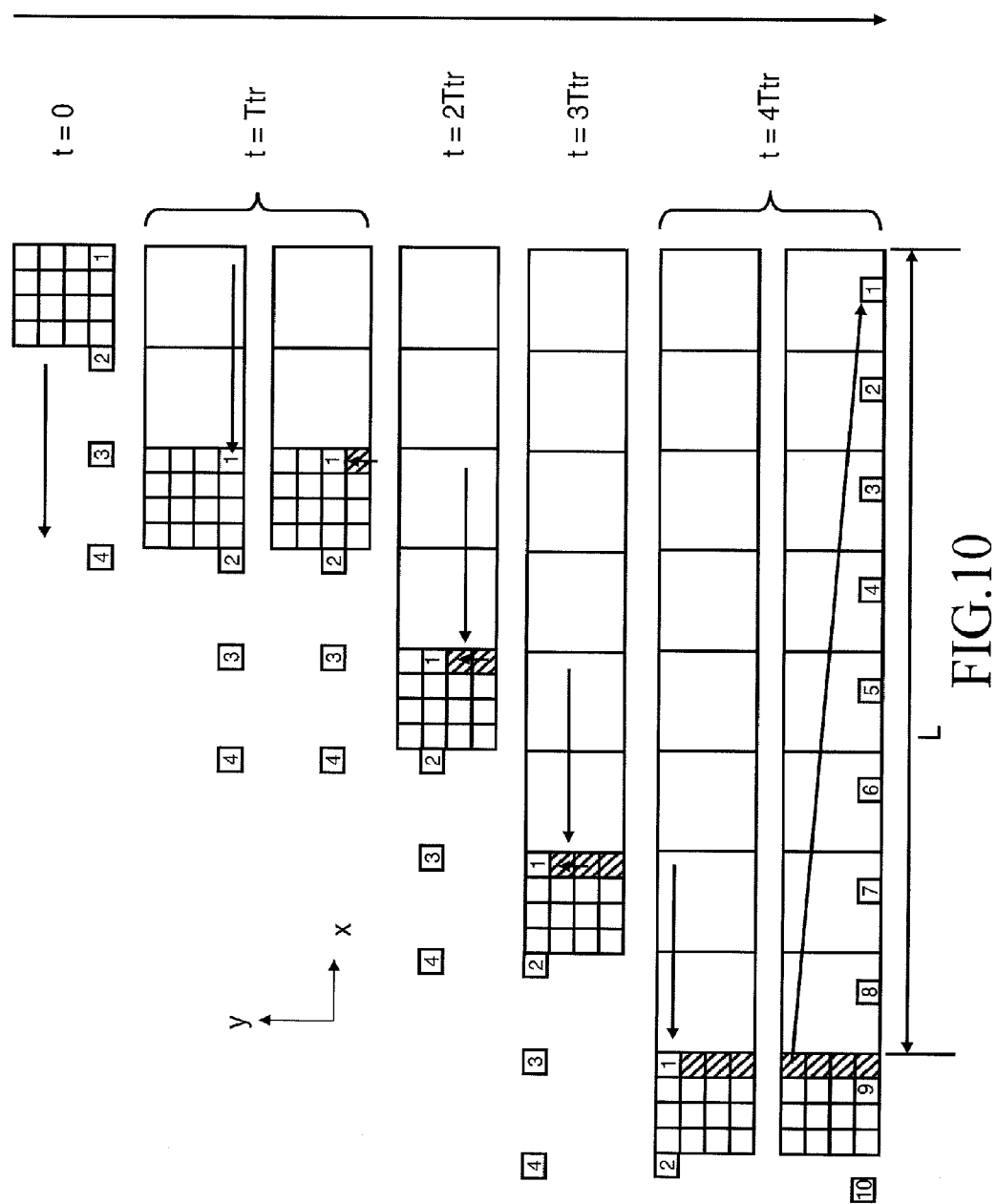
FIG. 10 illustrates an example of a writing method of multi-beams according to the first embodiment.

FIG. 10 illustrates an example of a writing method of multi-beams according to the first embodiment. FIG. 10 shows some grids to be written by respective beams at the coordinates (1, 3), (2, 3), (3, 3), . . . , (512, 3) in the third row in the y direction from the bottom in the multi-beams for writing the stripe region 32 shown in FIG. 9. In the example of FIG. 10, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 in a manner where the entire multi-beams 20 is collectively deflected by the deflector 208. In other words, tracking control is performed.

In the example of FIG. 10, one tracking cycle is executed by writing (exposing) four pixels while moving the distance of eight beam pitches.

Specifically, the stage position detector 139 measures the position of the XY stage 105 by irradiating a laser onto the mirror 210 and receiving a catoptric light from the mirror 210. The measured position of the XY stage 105 is output to the control computer 110. In the control computer 110, the writing control unit 50 outputs the position information on the XY stage 105 to the deflection control circuit 130. The deflection control circuit 130 calculates deflection amount data (tracking deflection data) for performing beam deflection to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 illuminates each pixel 36 with a corresponding beam in the ON state in the multi-beams 20 during a writing time corresponding to each pixel 36 within the maximum writing time Ttr of the irradiation time of each beam of the multi-beams of the shot concerned (total of divided shots, to be described later).

In the example of FIG. 10, during from the time t=0 to t=Ttr being the maximum writing time, using a beam (1) of coordinates (1, 3), beam irradiation of the first shot composed of a plurality of divided shots is performed to the first pixel from the right in the bottom row of the grid 29 concerned ("target grid", or "grid of interest"). The XY stage 105 moves, for example, two beam pitches in the −x direction during from the time t=0 to t=Ttr. During this time period, the tracking operation is continuously performed.

After the maximum writing time Ttr of the shot concerned has passed since the start of beam irradiation of the shot concerned, while the beam deflection for tracking control is being continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 10, when the time becomes t=Ttr, the pixel to be written (writing target pixel) is shifted from the first pixel from the right in the bottom row of the grid 29 concerned to the first pixel from the right in the second row from the bottom. Since the XY stage 105 is moving at a fixed speed also during this time period, the tracking operation is continuously performed.

Then, while the tracking control is continued, respective beams in the ON state in the multi-beams 20 are applied to shifted writing positions corresponding to the respective beams during a writing time corresponding to each of the respective beams within a maximum writing time Ttr of the shot concerned. In the example of FIG. 10, the first pixel from the right in the second row from the bottom of the grid 29 concerned is irradiated by the second shot using the beam (1) of coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 10, when the time becomes t=2Ttr, the pixel to be written (writing target pixel) is shifted from the first pixel from the right in the second row from the bottom of the grid 29 concerned to the first pixel from the right in the third row from the bottom by collectively deflecting the multi-beams by the deflector 209. Since the XY stage 105 is moving also during this time period, the tracking operation is continuously performed. Then, the first pixel from the right in the third row from the bottom of the grid 29 concerned is irradiated by the third shot using the beam (1) of coordinates (1, 3) during the time from t=2Ttr to t=3Ttr, for example. The XY stage 105 moves two beam pitches in the −x direction during the time from t=2Ttr to t=3Ttr, for example. During this time period, the tracking operation is continuously performed. When the time becomes t=3Ttr, the pixel to be written (writing target pixel) is shifted from the first pixel from the right in the third row from the bottom of the grid 29 concerned to the first pixel from the right in the fourth row from the bottom by collectively deflecting the multi-beams by the deflector 209. Since the XY stage 105 is moving also during this time period, the tracking operation is continuously performed. Then, the first pixel from the right in the fourth row from the bottom of the grid 29 concerned is irradiated by the fourth shot using the beam (1) of coordinates (1, 3) during the time from t=3Ttr to t=4Ttr, for example. The XY stage 105 moves two beam pitches in the −x direction during the time from t=3Ttr to t=4Ttr, for example. During this time period, the tracking operation is continuously performed. By the process described above, writing of the pixels in the first column from the right of the grid 29 concerned has been completed.

In the example of FIG. 10, after emitting a corresponding beam while switching the beam to the writing position of each beam which has been shifted three times from the initial position, the DAC amplifier 134 returns the tracking position to the start position of tracking where the tracking control was started, by resetting the beam deflection for tracking control. In other words, the tracking position is returned in the opposite direction to the direction of the stage movement. In the example of FIG. 10, when the time becomes t=4Ttr, tracking of the grid 29 concerned is released (removed), and the beam is swung back to a new target grid which has been shifted by eight beam pitches in the x direction. Although the beam (1) of the coordinates (1,3) has been described in the example of FIG. 10, writing is also similarly performed for each grid corresponding to a beam of other coordinates. That is, a beam of coordinates (n, m) completes writing of pixels in the first column from the right of a corresponding grid when the time becomes t=4Ttr. For example, a beam (2) of coordinates (2,3) completes writing of pixels in the first column from the right of a grid adjacent in the −x direction to the grid 29 concerned for the beam (1) of FIG. 10.

Since writing of the pixels in the first column from the right of each grid has been completed, in a next tracking cycle after resetting the tracking, the deflector 209 performs deflection such that the writing position of each corresponding beam is adjusted (shifted) to the second pixel from the right in the first row from the bottom of each grid.

As described above, each shot (a plurality of divided shots) of the pass concerned is performed while shifting the irradiation position pixel by pixel by the deflector 209, in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 8, the first shot position is adjusted to be the position shifted by one pixel, for example. Then, while performing a next tracking control, each shot is performed shifting the irradiation position by one pixel by the deflector 209. By repeating this operation during writing the stripe region 32, the position of the irradiation region 34 is shifted one by one, such as from 34a to 34o, to perform writing of the stripe region concerned.

In performing the above-mentioned writing processing, an incident dose $D(x)$ of a beam to each pixel is calculated as described below. The shot data generation unit 66 reads writing data from the storage device 140, and calculates, for each proximity mesh region, a pattern area density p of a pattern arranged in the proximity mesh region concerned. The shot data generation unit 66 virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 μm.

Next, the shot data generation unit 66 calculates, for each proximity mesh region, a proximity effect correction irradiation coefficient $Dp(x)$ (correction dose) for correcting a proximity effect. The proximity effect correction irradiation coefficient $Dp(x)$ can be calculated using a threshold model similar to a conventional one.

On the other hand, the shot data generation unit 66 calculates, for each pixel 36, a pattern area density $\rho'$ in the pixel 36 concerned. The mesh size of $\rho'$ is made to be the same as the size of the pixel 28, for example. An incident dose $D(x)$ to be applied to the pixel 36 concerned is calculated by multiplying by a reference dose, a proximity effect correction irradiation coefficient $Dp(x)$, and a pattern area density $\rho'$. The irradiation time of a beam to each pixel can be obtained by dividing the incident dose $D(x)$ by the current density J.

Figure 11:
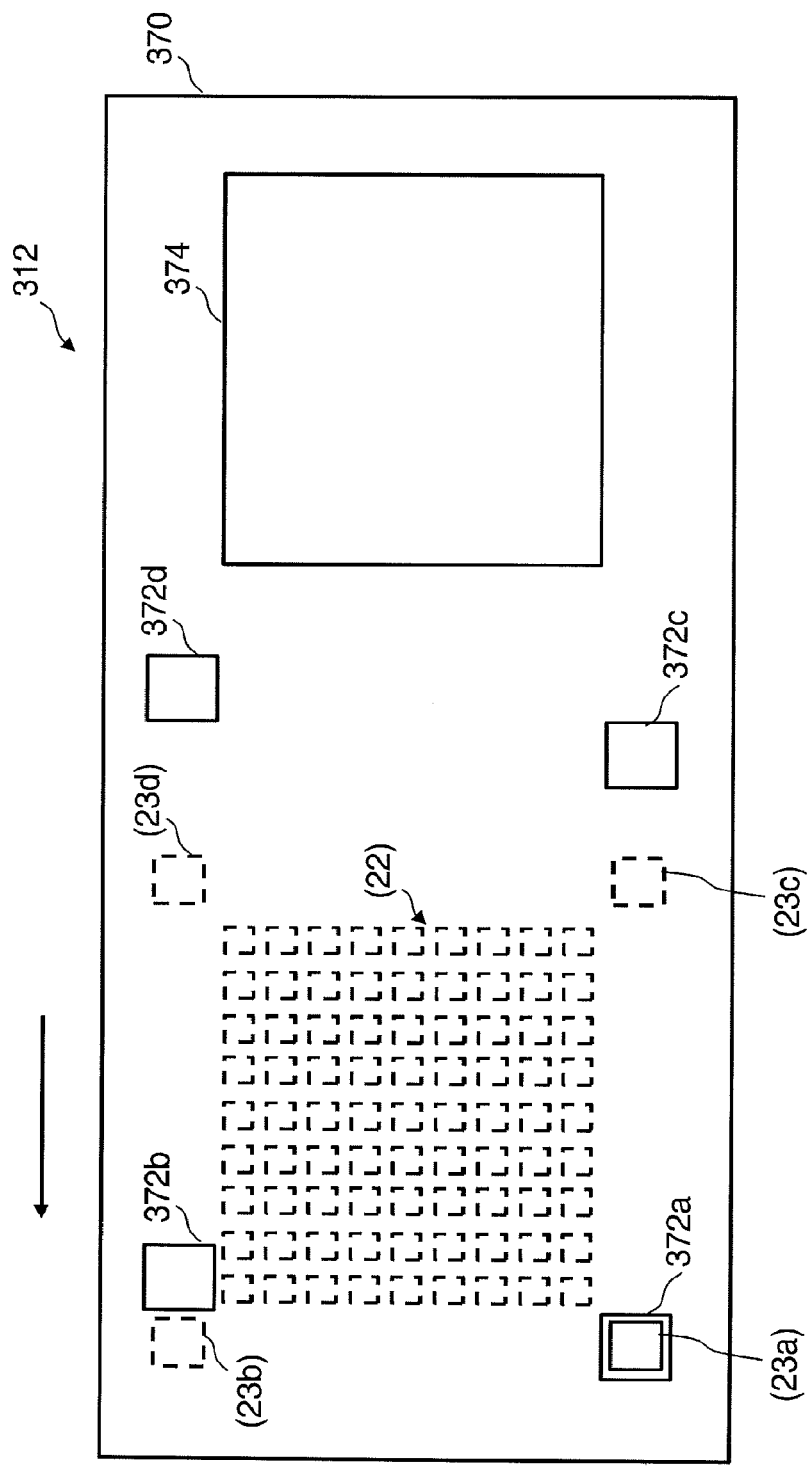
FIG. 11 is an upper surface conceptual diagrams showing another example of a shutter according to the first embodiment.

FIG. 11 is an upper surface conceptual diagrams showing another example of a shutter according to the first embodiment. In a frame 370 of a shutter 312 of FIG. 11, a plurality of openings 372a to 372d (second opening) are formed on the periphery of the whole of the openings 22 of the forming aperture array substrate 203 and at the four corners shifted in the x direction, for example. The size of each of a plurality of openings 372a to 372d is a little larger than that of the hole 23. An opening 374 is formed at a position shifted in the x direction from a plurality of openings 372a to 372d.

In the example described above, when measuring the position of each calibration beam 21, the multi-beams 20 after being formed are maintained to be in the state of beam OFF by blanking control, but, it is not limited thereto. As another method, the shutter 312 shown in FIG. 11 can be used. When measuring the position of each calibration beam 21, the shutter 312 itself blocks the electron beam 200 so that all the holes 22 of the forming aperture array substrate 203 may not be irradiated with the electron beam 200. Then, when performing usual writing processing, the position of the shutter 312 is greatly shifted so that all the holes 22 of the forming aperture array substrate 203 may be in the opening 374. Also, by this structure, each position of a plurality of calibration beams 21 can be detected one by one.

As described above, according to the first embodiment, compared with the case where a portion of the multi-beams 20 is used for the calibration beam, since it is possible to increase the current amount of each calibration beam 21 without enlarging the beam area itself of the calibration beam 21, an S/N ratio can be substantially obtained. Further, since it is not necessary to enlarge the beam area itself of the calibration beam 21, the influence of deflection distortion and field curvature aberration can be reduced. Furthermore, in the case of the optical system whose focus depth is shallow, calibration can be performed on the same Z flat surface as the target object 101 to be written, by using the calibration beam 21 formed on the same flat surface as the multi-beams 20 for writing. Therefore, a simple and reliable device configuration can be obtained.

As described above, according to the first embodiment, the shape of a multi-beam image can be measured while substantially obtaining an S/N ratio and reducing the influence of deflection distortion and field curvature aberration.

Embodiments have been explained referring to specific examples described above. However, the present invention is not limited to these specific examples. Although the example described above shows the case of adjusting the shape of the irradiation region of the whole multi-beams by adjusting the excitation to electromagnetic lenses configuring the reduction optical system, other lenses may also be arranged. For example, rotation and magnification of the shape of the irradiation region of the whole multi-beams may be adjusted by arranging an electrostatic lens in each magnetic field of the reducing lens 205 and the objective lens 207.

While the apparatus configuration, control method, and the like not directly necessary for explaining the present invention are not described, some or all of them can be selectively used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi charged particle beam apparatus and method for adjusting the shape of a multi charged particle beam image that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam apparatus comprising:
   a stage configured to mount a target object thereon and to be continuously movable;
   an emission source configured to emit a charged particle beam;
   a forming aperture array substrate, where there are formed a plurality of first openings and a plurality of second openings which are on a periphery of a whole of the plurality of first openings and each of which is larger than each of the plurality of first openings, configured to form multi-beams by making a region including a whole of the plurality of first openings irradiated by the charged particle beam and by making portions of the charged particle beam individually pass through a corresponding one of the plurality of first openings, and to be able to form a plurality of calibration beams by making a region including the plurality of second openings irradiated by the charged particle beam and by making portions of the charged particle beam individually pass through a corresponding one of the plurality of second openings;
   a shutter configured to select, one by one, one of the plurality of calibration beams which are formed by passing through the plurality of second openings, in accordance with a slide position;
   a mark arranged on the stage;
   a deflector configured to deflect a selected calibration beam of the plurality of calibration beams;
   a detector configured to detect a secondary electron including a reflected electron generated by scanning the mark by deflecting the selected calibration beam, in a state where all the multi-beams have been controlled to be OFF; and
   an irradiation region shape calculation processing circuit configured to calculate a shape of an irradiation region of a whole of the multi-beams by inputting, in order, a detection result of the secondary electron corresponding to each of the plurality of calibration beams which is obtained by switching the slide position of the shutter.

2. The apparatus according to claim 1, further comprising:
   a reduction optical system configured to reduce an image of the multi-beams; and
   a lens control circuit configured to adjust the shape of the irradiation region of the whole of the multi-beams by adjusting excitation to lenses configuring the reduction optical system.

3. The apparatus according to claim 1, wherein, in the shutter, an opening equal to or larger than the irradiation region of the whole of the multi-beams is formed.

4. The apparatus according to claim 3, wherein the opening formed in the shutter is in a size where, in addition to the plurality of first openings, second openings whose number is same as that of the plurality of second openings can be arranged in a slide direction.

5. The apparatus according to claim 1, wherein the shutter is arranged between the emission source and the forming aperture array substrate.

6. The apparatus according to claim 1, wherein each of the plurality of second openings is formed in a size where one hundred or more first openings in the plurality of first openings can be arranged.

7. The apparatus according to claim 6, wherein the each of the plurality of second openings is formed in a size where one thousand or more first openings in the plurality of first openings can be arranged.

8. A method for adjusting a shape of a multi charged particle beam image comprising:
   forming multi-beams by letting portions of a charged particle beam individually pass through a corresponding opening of a plurality of first openings formed in a forming aperture array substrate, and forming a calibration beam by letting a portion of the charged particle beam pass through one of a plurality of second openings which is temporarily selected by sliding a shutter, each of the plurality second openings being larger than each of the plurality of first openings and formed on a periphery of a region including a whole of the plurality of first openings of the forming aperture array substrate;
   controlling all the multi-beams to be OFF;
   detecting a secondary electron including a reflected electron generated by scanning a mark on a stage on which a target object is placed, in order, for each of a plurality of calibration beams each corresponding to any one of the plurality second openings, while switching the each of the plurality of calibration beams formed by the plurality of second openings by switching a slide position of the shutter, in a state where the all the multi-beams have been controlled to be OFF;

calculating a shape of an irradiation region of the whole of the multi-beams by inputting, in order, a detection result of the secondary electron corresponding to the each of the plurality of calibration beams formed by the plurality of second openings; and adjusting the shape of the irradiation region of the whole of the multi-beams by adjusting excitation to lenses configuring a reduction optical system for reducing an image of the multi-beams.

9. The method according to claim 8, wherein, as each of the plurality of second openings, an opening having a size in which one hundred or more first openings in the plurality of first openings can be arranged is used.

10. The method according to claim 8, wherein, as the each of the plurality of second openings, an opening having a size in which one thousand or more first openings in the plurality of first openings can be arranged is used.

* * * * *